United States Patent
Komatsu et al.

[19]

[11] Patent Number: 6,140,006
[45] Date of Patent: Oct. 31, 2000

[54] INTEGRAL MEMBRANE LAYER FORMED FROM A PHOTOSENSITIVE LAYER IN AN IMAGEABLE PHOTORESIST LAMINATE

[75] Inventors: Toshifumi Komatsu; Alexander S. Gybin; Kyle Johnson; Dylan E. MacLean, all of Duluth, Minn.

[73] Assignee: The Chromaline Corporation, Duluth, Minn.

[21] Appl. No.: 09/097,419

[22] Filed: Jun. 15, 1998

[51] Int. Cl.[7] .............................. G03C 1/76; G03C 1/805
[52] U.S. Cl. .................. 430/156; 430/261; 430/273.1
[58] Field of Search ........................... 430/156, 162, 430/261, 273.1

[56] References Cited

U.S. PATENT DOCUMENTS

| | | | |
|---|---|---|---|
| 3,808,751 | 5/1974 | Usui | 51/312 |
| 4,268,601 | 5/1981 | Namiki et al. | 430/159 |
| 4,272,620 | 6/1981 | Ichimura | 525/61 |
| 4,430,416 | 2/1984 | Goto et al. | 430/263 |
| 4,530,896 | 7/1985 | Christensen et al. | 430/155 |
| 4,587,186 | 5/1986 | Nakamura at al. | 430/14 |
| 4,764,449 | 8/1988 | VanIseghem | 430/162 |
| 4,985,344 | 1/1991 | Uchino et al. | 430/325 |
| 5,057,394 | 10/1991 | Yabe et al. | 430/145 |
| 5,158,857 | 10/1992 | Shinozaki et al. | 430/262 |
| 5,260,173 | 11/1993 | Birkholm | 430/325 |
| 5,415,971 | 5/1995 | Couture et al. | 430/260 |
| 5,427,890 | 6/1995 | Suzuki et al. | 430/263 |
| 5,518,857 | 5/1996 | Suzuki et al. | 430/160 |
| 5,629,132 | 5/1997 | Suzuki et al. | 430/258 |

FOREIGN PATENT DOCUMENTS

| | | |
|---|---|---|
| 55-135834 | 10/1980 | Japan . |
| 59-154442 | 9/1984 | Japan . |
| 3-79270 | 4/1991 | Japan . |

OTHER PUBLICATIONS

Aicello Photo Masking (APM) Film Product Brochure.

*Primary Examiner*—Janet Baxter
*Assistant Examiner*—Yvette M. Clarke
*Attorney, Agent, or Firm*—Merchant & Gould P.C.

[57] ABSTRACT

An integral membrane can be formed in sheet-like photosensitive laminate structures. The process for forming the structure involves coating a first relatively thin photosensitive layer on a substrate or carrier film, then forming a second relatively thicker photosensitive layer (when compared to the first layer) on the first layer. The structure is exposed by directing appropriate actinic radiation against the substrate, film or carrier layer under controlled conditions such that only the first layer is substantially exposed to radiation resulting in polymerization or crosslinking and a substantial reduction in the solubility of the first layer. The relatively thinner less soluble layer then acts as a peelable integral release layer in the photosensitive structure. The thicker second layer can then be imagewise exposed to actinic radiation, and then used conventionally in imaging processes such as sandblasting.

28 Claims, 6 Drawing Sheets

INTEGRAL MEMBRANE LAYER FORMED FROM A PHOTOSENSITIVE LAYER IN AN IMAGEABLE PHOTORESIST LAMINATE

FIELD OF THE INVENTION

The invention relates to a thin peelable layer in a photosensitive laminate, made by a process using light to form an integral peelable, substantially less water soluble layer, from a photosensitive laminate layer within a three layer photosensitive structure. More specifically, the invention relates to a photosensitive film laminate comprising at least three layers including a carrier or substrate, a peelable, thin photosensitive layer and a thicker imageable photosensitive layer. The layer comprising a peelable photosensitive layer is exposed and rendered less soluble, in an aqueous developer or developing solvent, than a second imageable photosensitive layer in the photosensitive laminate structure. Such second imageable photosensitive layer structure can be imagewise exposed to form an image in the imageable photoresist in a conventional manner. The image can then be transferred to a surface for appropriate surface modification using (e.g.) sandblasting.

BACKGROUND OF THE INVENTION

Photosensitive laminate structures have been used for many years in imaging surfaces of objects. A variety of photosensitive resins have been formulated in a variety of useful layers in these laminate structures. Electromagnetic radiation such as UV or light has been commonly used to imagewise expose such laminates and form an image in the laminate structure. The images can be then transferred to a surface for selective surface modification.

Ichimura, U.S. Pat. Nos. 4,272,620 and 4,564,580 discloses a photosensitive stilbazolium material comprising a styrylpyridinium group in a photosensitive resin. Such a material is disclosed for use in a layered structure. Namiki et al., U.S. Pat. No. 4,268,601 disclose a layered structure comprising a transparent support layer, a polyvinyl alcohol layer, a photosensitive resin composition and optionally an adhesive layer that can be used to adhere the material to a substrate. Goto et al., U.S. Pat. No. 4,430,416 disclose a transfer element for sandblasted carving comprising in order; a flexible substrate, a strippable intermediate resin layer having pressure sensitive properties and a photosensitive resin layer. Christensen et al., U.S. Pat. No. 4,530,896 disclose a light sensitive laminate comprising a support layer, a light sensitive photoresist layer and an intermediate protection layer comprising a light transmitting material. VanIseghem, U.S. Pat. No. 4,764,449 discloses a photoresist laminate comprising an adhesive layer, a membrane support layer and a resist layer which can be used in etching the surface of an article with a pattern. Suzuki et al., U.S. Pat. Nos. 5,427,890, 5,518,857 and 5,629,132 disclose a photosensitive laminate film useful in making an imaged mask comprising a substrate layer, a peelable image mask protection layer and a photosensitive layer. Suzuki et al. claim a non-photosensitive image mask protection layer that can be made from a peelable non-photosensitive water insoluble material such as polyvinyl alcohol derivatives, polyvinyl butyral, ethyl cellulose, cellulose acetate, cellulose nitrate and others. The image mask layer contains no exposed or unexposed photosensitive material and is formulated to protect and transfer the imaged layer to a surface. Suzuki et al. emphasize a choice of non-photosensitive materials that renders the image mask protection layer weakly adhered to the supporting sheet so it can be easily peeled.

Birkholm, U.S. Pat. No. 5,260,173 teaches a process for forming an integral membrane in a photosensitive laminate. The Birkholm structure comprises a support and a single photoimageable layer. An integral membrane or layer is made in the single photosensitive layer by exposing the photoresist with a proper amount of electromagnetic radiation for a controlled period of time to form a thin controllable integral membrane layer in the imageable photoresist while leaving the major part of the imageable layer unexposed for later imaging. The integral membrane, during processing including exposure and wash out, remains intact and greatly enhances the amount of detail available for transfer in the imagewise exposed portion of the photoresist layer. In Birkholm FIGS. 1 through 7 show several operating modes. In a first mode (see FIG. 3), after imaging, the integral membrane is formed by back exposing the unexposed areas without an image transfer means. In a next mode (see FIG. 7), the two layer structure comprising a support and a photoresist layer is exposed by radiation directed substantially normal to the surface of the resist layer for a controlled period of time to produce, on the surface of the resist layer, a thin integral membrane. In this mode the membrane is formed on the exterior of the resist, opposite the film carrier. In a last mode of operation (see claim 8) Birkholm suggests exposing the photosensitive laminate to radiation substantially normal to the substrate side for controlled period of time to produce a controlled integral membrane that is formed in the photosensitive layer at the interface between the substrate and the photosensitive layer. In these modes the membrane is formed in the interior of the structure. In the Birkholm et al. options, the integral membrane is formed from a single layer of photosensitive material formed on the substrate by controlled exposure to actinic radiation. For this technology to be successful, the exposure of the peelable layer must be done carefully. Lack of care in the exposure and image development can result in lack of control of layer dimensions, (i.e.) a thick or a thin layer. These variations can result in difficult processing and inconsistent results.

BRIEF DISCUSSION OF THE INVENTION

A substantial improvement in product quality and processability can be obtained if an integral layer is formed in the photosensitive laminate structure using a process which involves combining a support film with a first relatively thinner (compared to later formed layers) photosensitive layer and a second relatively thicker (compared to the first layer) photosensitive layer. In this structure the thin and thick layers can have any order and other intermediate layers can be formed. After the formation of the three layer structure, the structure can be exposed actinic radiation to form an integral membrane layer such that only the thinner photosensitive layer is exposed and rendered substantially less soluble than the thicker photosensitive layer. Preferably the radiation is directed against the substrate or film layer side under controlled conditions to expose only the thinner layer. The thin integral layer formulation and its separate formation as a layer causes the layer to be easily peelable from the substrate. The substrate is typically removed before surface modification of the object. This thin integral layer is not inherently removable from the second layer. The layer is typically removed by abrasion during surface modification (e.g.) sand blasting operations. The imageable second layer is ultimately removed after image formation on a surface. For the purposes of this application, the term "substrate" typically refers to a film or other thin typically substantially transparent layer upon which the photoimageable layers are formed. The term "surface" typically refers to an object surface that is modified, blasted, etched, etc., using a process like sandblasting with a mask formed from the photoimaged laminate structure of the invention. Solubility refers to solubility of the resist layers in the aqueous media commonly used to develop the resist. "Image" and "image transfer" refers to the image formed in the photosensitive layer. "Surface modification" refers to the use of the image in the developed laminate to transfer the developed image onto the surface. Forming the integral layer in a process having at least two coating processes forming a defined integral layer improves differentiation of the layers and also defines the thickness of the integral layer. The freedom of formulation for the peelable layer permits use of formulations that improves peelability at the interface with the substrate and improves overall operations by using formulations optimized for either the thinner layer or the thicker imageable layer. For example colors can be used to identify the layers. The layers can be formulated with different photopolymers, different sensitizers, different amounts of radiation absorbents. These variants modify the photosensitive properties (change $\lambda_{max}$, change relative speed, etc.) and improve the ease of differentiation between layers.

The three layer laminate structure comprises a support or film layer, a relatively thinner photosensitive layer that can be exposed to form the integral membrane and a second relatively thicker imageable photosensitive layer. In a second embodiment of the invention, the substrate can have a preformed release layer between the substrate and the first layer. The first layer can also have a preformed release layer between the first layer and the second layer to promote the peelably removable property of the first layer from the second layer. In these embodiments, the first layer can be formulated with a photoimageable formulation that when exposed and rendered less soluble than the second layer, the first layer is not inherently peelably removable from the second layer without a release layer. The second layer can be formulated to be more adherent to facilitate transfer of the imaged second layer to a surface for image formation.

A first aspect of the invention comprises, in any order, a laminate structure comprising a support, a first relatively thinner unexposed photosensitive layer and a second relatively thicker unexposed photosensitive layer. Such a structure is adapted for exposure first to actinic radiation directed at the surface of the support film to expose and render the first layer less soluble than the second layer for greater imaging.

A second aspect of the invention comprises, in any order, a photosensitive laminate structure comprising a support or film layer, a first relatively thinner exposed photosensitive layer forming an integral membrane, peelably removable from the support, and a relatively thicker second imageable photosensitive layer that can be imaged to form an image that can be transferred to a surface.

These aspects of the invention can be embodied in one of two structures. In one structure, a support layer is directly coated with the first thinner photosensitive layer and upon the first thinner photosensitive layer is coated the second relatively thicker photosensitive layer. Alternatively, the structure of the three layer laminate of the invention can comprise a support or carrier layer. Directly coated onto the carrier layer can be the second relatively thicker photosensitive layer followed by a relatively thinner photosensitive layer. Either or both of these structures can have other functional layers formed in or on the laminate structures to improve processability, photoimaging, or surface modification.

A third aspect of the invention are processes for forming an image using the three layer structure of the invention. In one process, the three layer structure comprising a support, a first relatively thinner photosensitive layer and a second relatively thicker photoimageable layer is first exposed to actinic radiation directed to the support side of the structure preferably in a direction normal to the support surface. The radiation then renders the first layer less soluble than the second photoimageable layer. The structure can either be stored for later use or can be immediately used for imaging purposes. At a desired moment, the second unexposed imageable layer is then imagewise exposed to actinic radiation forming the image in the second layer which is then conventionally developed, processed and transferred to a surface for conventional modification in the surface such as sandblasting. The process as set forth in the third aspect of the invention can be practiced with a variety of process steps. For example, the laminate of the invention in a roll to roll mode, can be exposed on the support side of the laminate to actinic radiation sufficient to expose the thinner layer resulting in a substantially reduced solubility in the thinner layer. The roll to roll laminate can then be stored and shipped to a customer for subsequent use. This laminate can have the first thinner layer in contact with the support or can have the second thicker layer in contact with the support. These structures can be imaged and applied using appropriate processing steps. Useful processes involving either useful structure of the invention are set forth in greater detail below.

In each aspect of the invention, after etching is complete and a pattern is fully formed on a surface of an object, the remaining imaged portions of the laminate can be removed either mechanically or chemically from the surface of the object by gentle cleaning. The preferred mode of image formation is sandblasting in which a high velocity abrasive particulate etchant is directed typically in an air blown mode against a masked surface of the object for image formation. For the purpose of this application, the term "integral membrane" indicates a membrane made by exposing a photoresist sheet to a proper amount of electromagnetic radiation for a specific period of time to produce a controllable integral membrane layer in the imaged photoresist sheet. The integral membrane when exposed to solvent by the use of a wash-out process, the integral membrane remains intact and greatly enhances the amount of detail available for transfer. In the application, the integral membrane is made by a coating process that coats a membrane layer in combination with the photosensitive layer. The appropriate exposure of the integral membrane layer to actinic radiation can produce a layer that is more insoluble than the photoresist layer forming the useful integral membrane layer that provides benefits during processing of the imaged film.

DETAILED DISCUSSION OF THE INVENTION

The structure of the invention typically includes a film or support layer, a first relatively thinner photosensitive layer and a second relatively thicker photosensitive layer. The structure can also include layer formulations, layers or treatments that render the layers easily peelable, one from the other.

Film or Support Layer

The film or support layer of the invention comprises a web, film or other relatively thin substrate which can be coated with the photosensitive compositions of the invention. This film or substrate layer must be mechanically strong to permit rapid coating manufacture of the resist laminate, but can also be processable in typical exposure processing and imaging environments of use of the invention. Preferred sheet-like film or support layers can comprise transparent films, i.e. a thickness of about 0.05 to 0.3 mm (2 to 12 mils) and can be made from a variety of natural or synthetic materials including treated cellulose, paper, polyolefin resins, polyester resins, polyvinylchloride resins, etc. Preferred sheet-like materials for use in this invention are thin, less than 0.15 mm (6 mil), preferably less than 0.07 mm (3 mil) polyethylene terephalate polyester (Mylar sheets). Such sheets are typically removable during processing.

Photosensitive Layer

The photoimageable laminate of the invention generally comprises two photosensitive layers formed on the film or support. The photosensitive layer is a laminate that generally comprises either negative or positive photosensitive or photoresist materials. Negative working photoresist compositions typically interact with light to transform the composition from the soluble state to an substantially less soluble film. Positive working photoresist compositions are transferred from an insoluble state to a soluble state. Typically resist compositions contain reactive monomeric and/or polymeric substances along with photoactivated initiators.

The preferred mode of operation of the photosensitive structure of the invention involves negative resist processing. In such processing, substances in the photoresist can react polymerize or crosslink when exposed to a sufficient quantity of actinic radiation of an appropriate wavelength to activate the reactive components of the resist photosensitive layers. In a typical formulation, the electromagnetic radiation is typically absorbed by the photosensitive polymer, photoactivators or initiators which initiate or participate in polymerization or crosslinking in the photosensitive layer. Such reactions typically render the photosensitive material where exposed less soluble or substantially less soluble to the action of solvents including water, alcohols, hydrocarbons, chlorinated hydrocarbons, etc. In the first layer, the radiation renders the entire first layer relatively less soluble when compared to the second layer. The uniformity of the polymerization or reaction in the first layer is critical to forming a useful integral membrane that can be used in further processing. In the second layer, the radiation is directed into the second layer in an imagewise manner to form selectively insoluble regions for imaging purposes. In the second layer, the unexposed resist remains soluble and can be easily removed by action of aqueous media or solvents forming the image which can be transferred to the surface of an object. The preferred photosensitive compositions contain a polymerizable or crosslinkable polymeric composition in a formulation with a polymeric material. The photoresist compositions can optionally contain other functional materials including surfactants, defoamers, dyes antioxidants and other additives that can aid in the formation of a thin uniform layer without holes, thin spots or other variations in the thin uniform layer.

Crosslinkable polymers can inherently crosslink with other reactive components or can crosslink with a separate crosslinking agent resulting in substantial insolubility of the crosslink polymer structure. Such crosslinking results in a film of reduced solubility that can be transferred to the surface of an object for image formation. Further, the crosslinking can be used to form the integral membrane of the invention. Useful crosslinkable polymer compositions comprise polymers having sufficient pendant hydroxyl groups to react with sufficient concentration of a photoinitiator/crosslinking species. Such polymers can generically be considered homopolymers or copolymers of partially or fully saponified polyvinylacetate. Such materials are commonly made by polymerizing vinyl acetate and removing acetyl groups leaving the pendant hydroxyls. In this way, homopolymers and copolymers can be made by polymerizing vinyl acetate with a variety of ethylenically unsaturated monomers to form the polymer for later saponification. Such polyvinyl alcohol homopolymers and copolymers can also be used as film forming agents in forming photosensitive layers using other species as crosslinkable materials. The final polyvinyl alcohol polymers and copolymers are characterized by molecular weight and degree of hydrolysis. The common molecular weights of commercial polyvinyl alcohol materials are reflected in the viscosity of a 4 wt % solution measured in centipoise (cP) at 20° C. with a Brookfield viscometer. The viscosity of a 4 wt % solution can range from about 5 to about 65 cP. Such materials can have from about 85 to 99.5%+ of the acetate groups removed from the polymer structure. Useful polyvinyl alcohols include ELVANOL® and GOHSENOL® materials.

A useful photosensitive resin composition of the invention uses a group of generic photosensitive reactant groups including the generic formula of a stilbazolium group:

or a reverse stilbazolium group, such as, for example, formulae 1:

and others. Such groups are commonly connected, as shown, with a polymer backbone using a variety of attachment chemistries. Preferably, the groups are attached using a condensation reaction between an aldehyde group in the photosensitive structure with a polyvinyl alcohol homopolymer or copolymer. In the structures, $R_1$ or $R_2$ represents a structure selected from the group consisting of a hydrogen atom, alkyl groups and lower hydroxy alkyl groups having 1 to 6 carbon atoms.

Stilbazolium materials are used as the raw material for this photosensitive resin used in either the first or second layers of the invention possesses a formyl group and can include such materials as α-(p-formylstyryl)-pyridinium, γ-(p-formylstyryl)-pyridinium, α-(m-formylstyryl)-pyridinium, etc. These pyridinium quaternary materials may be present in the form of salts of acids such as a hydrochloride, hydrobromide, perchlorate, tetrafluoroborate, phosphate, sulfate, etc.

Another class of useful photocrosslinkable materials include diazonium salt photocrosslinking compositions. Diazonium salt crosslinkers, when contacted by typically ultraviolet light, yield one molecule of nitrogen per diazonium group and generate active crosslinking nitrogen containing species. Suitable diazonium photoinitiated crosslinkers include para-diazodiphenylamine chloride—0.5 zinc chloride—formaldehyde condensates, para-diazodiphenylamine sulfate—formaldehyde condensate, tetrazonium salts, etc. (see Tsunoda and Yamaoka, J. Appl. Poly. Sci., Vol. 8, pp. 1379–1390 (1964)).

In forming the first layer and the role of a thicker second layer, photosensitive materials in the laminate of the invention, different materials can be used in forming the layers. In other words, the first layer can comprise a diazo material and the second layer can comprise a stilbazolium material. Alternatively, the first layer can comprise a substituted stilbazolium material while the second layer can comprise an unsubstituted stilbazolium material. The photosensitivity of the material in the first layer should be different than the material in the second layer thus ensuring that the first layer, when exposed to actinic radiation, is fully crosslinked before the actinic radiation affects the second layer in a substantial way. The formulations of the first layer can involve the use of photosensitive material and photoinitiators that tend to react more readily than the materials on the second layer. Further, the sensitivity to actinic radiation can also be beneficially used. If the $\lambda_{max}$ of the first layer is different than the $\lambda_{max}$ of the second layer, the use of electromagnetic radiation that peaks in the $\lambda_{max}$ of the first material will tend to be less effective in exposing the material in the second layer. Accordingly, a preferred mode of operation involves using a photosensitive material in the first layer having a $\lambda_{max}$ that differs from the $\lambda_{max}$ of the material in the second layer by at least 10 nanometers. In other words, the $\lambda_{max}$ of the photosensitive material in the first layer can be a number such as 320 nm, 330 nm, 340 nm, respectively. In the other layer, the $\lambda_{max}$ of the material should be either 310 nm or 330 nm, 320 nm or 340 nm, or 330 or 350 nm, etc., respectively. Increasing the difference between the $\lambda_{max}$ of the first layer and the second layer will also enhance the separate exposure of the first layer from the exposure of the second layer. Accordingly, the difference between the $\lambda_{max}$ of the first layer and the second layer can preferably be greater than 15 nm or most preferably greater than 20 nm. The $\lambda_{max}$ is an inherent property of the photosensitive material and relates to the wavelength of electromagnetic radiation, most strongly absorbed by the chemical structure of the photosensitive material. The $\lambda_{max}$ can be modified in a material by changing its chemical structure. In one preferred mode of operation, the stilbazolium material can be used in one layer while a methoxy substituted stilbazolium material can be used in a different layer. The methoxy substitution introduces a substantial, greater than 20 nm difference in $\lambda_{max}$ between the first and second layers. The relative speed of the first layer with respect to the second layer can be modified by increasing the speed of one layer by increasing the concentration of the initiator or by increasing the concentration of the synergist or both. The "speed" of the layer is substantially increased with an increased concentration of the synergist. Alternatively, the speed of one layer versus the other layer can be modified by increasing the amount of a light absorber in the layer to cause the layer to be relatively "slow" with respect to the other layer. Such light absorbers can include dyes, pigments, particulates or any other material that can either reflect or absorb ultraviolet or other sensitizing radiation. Organic dyes can be selected with an appropriate maximum wavelength absorption. Alternatively, pigments, particulates or other absorbing material that absorbs broadly across the spectrum can also be used. Such broad spectrum absorbents include such particulates as titanium dioxide, finely divided activated carbon, finely divided titanium dioxide and finely divided inorganic fillers such as calcium carbonate, etc.

The photoresist compositions of the invention can further include a film forming polymeric binding agent. During photocrosslinking of the composition, the binding agent is entrapped in a mesh formed by the polymerizing or crosslinking polymeric materials. In this way the binding agent adds to the insolubility on the film forming potential of both the first layer forming the integral membrane and in the second layer forming the image. Typically, polymeric binding agents comprise relatively water insoluble polymers that can be formed into latices or stable suspensions of small particles in the polymer composition in water or aqueous media. Such polymer suspensions are well known in the art and available from a number of suppliers. Suitable binding agents used in the invention include carboxymethyl cellulose, partially hydrolyzed polyvinyl alcohols, water insoluble homopolymers and copolymers made of comonomers such as styrene, methylmethacrylate, vinyl acetate, vinyl butyl, vinyl pyrrolidone, ethylene, propylene, alkylene oxide monomers and other monomers. Preferred polymeric binding agents comprise polyvinyl acetates for reasons of compatibility with polyvinyl alcohol polymers, the economy and stability of their suspensions in aqueous media. Such polymer compositions are broadly available from a variety of manufacturers. The photoresist compositions can contain plasticizer components that can help in providing resiliency and adhesion to the layers, can permit the layers to resist flaking and delamination during use. The resist can also use surfactants which can be used to increase compatibility of the materials in coating operations and to maintain the uniformity of the aqueous materials used in the coating operations.

The removability of the support layer from the first layer can be promoted by careful formulation of the first layer or by introducing a release layer between the support, the first layer and between the first layer and the second layer. Such release layers can comprise particulate materials, Teflon materials, silicone materials, and other known compositions.

The exposure of the first layer and the second layer to form either a relatively less soluble membrane support in the layer or an imaged second layer involves the action of actinic radiation. The radiation needed to expose the photosensitive materials in the resist are known. In the case a sensitizer is used in photocrosslinking material, an appropriate wavelength of radiation is used to activate the sensitizer. In the instance the photosensitive material is self-crosslinking, using a styrylpyridinium, a diazo material, ammonium bichromate, quinolinium, crotonate, etc., containing polymers, a wavelength of light is used that can activate the photosensitive structures in the polymeric material and cause crosslinking. Sensitizers commonly used in photopolymerizable materials requiring sensitizers are typically monomeric materials that can absorb light radiation for activating ethylenically unsaturated groups. Said groups are vinyl, acroyl, methacroyl, allyl, vinyl ether, acrylamido, etc. Groups or prepolymers thereof having an average degree of unsaturated saturation between about 1 and 5. These materials are well known and used in the art and include acrylamide acrylic acid, methacrylic acid, ethylmethacrylate, methylmethacrylate, methylolacrylamide, etc. Preferred polyfunctional sensitizers having two or more photosensitive ethylenically unsaturated groups include such sensitizers as pentaerythritol triacrylate, pentaerythritol tetracrylate and related di-, tri-, or tetraunsaturated pentaerythritol derivatives, trialylisocyanurate and others.

Typically the aqueous photocrosslinkable resist composition contains about 0.1 to about 75 wt %, preferably about 5 to 35 wt % of a photocrosslinkable or photopolymerizable composition that can be crosslinked using a sensitizer or is self-crosslinking. In the case the material is crosslinked using a sensitizer, a polyvinyl alcohol polymer is used in amounts of about 20 to 75 wt %, preferably about 25 to 45 wt %. In the case of a self-crosslinking material containing a styrylpyridinium group or a diazo group, the aqueous resist composition can contain about 3 to about 40 wt % of such a material. Regardless of the mode of crosslinking, the resist can contain a film forming polymeric binder, optionally a plasticizer and other materials such as a surfactant, a defoamer, a dye, an antioxidant, a perfume or other functional materials.

The photosensitive resist materials of the invention can be made by coating the aqueous materials on a support layer or film. In the preferred mode for manufacturing the invention, a support film is coated with a first layer. The first layer typically has a dry thickness of between about 0.001 mm to 0.01 mm (1 to 10μ), preferably about 0.003 mm to 0.007 mm (3 to 7μ). Once the first layer is formed and rendered into a relatively soluble intact layer, the second relatively thicker layer can then be directly coated on the first layer. The relatively thicker layer has a thickness of about 0.03 mm to 1 mm (about 1 to 40 mil), preferably about 0.05 mm to 0.3 mm (2 to 10 mil). Such coating operations can be performed conventionally using the aqueous materials discussed above.

The photosensitive laminates of the invention are applied to the surface of an object for surface modification using adhesive properties of the laminate or the object surface. In one mode, an adhesive layer is applied either to the laminate or to the surface of the object in the appropriate location and the laminate is then adhered to the surface of the object using the adhesive layer. Such adhesive layers are typically aqueous dispersions of vinyl polymers that can have effective amounts of tackifier and/or plasticizer materials that introduce pressure sensitive adhesive properties into an adhesive layer. Such adhesives are well within the scope of the artisan in this area. Alternatively, the photosensitive laminate of the invention can be formulated with a top layer having inherent adhesive properties. In this regard, additive materials can be introduced into the formulation for forming the top layer of the photosensitive laminate that imparts pressure sensitive properties to the photosensitive material. Typically, photosensitive materials contain a polyvinyl acetate emulsion that when combined with appropriate and effective amounts of plasticizer and/or tackifier materials, provide sufficient pressure sensitive adhesive properties such that the layer is sufficiently bonded to the surface of the object to maintain the laminate in a place for a sufficient amount of time to modify the surface with sandblast, etching or other surface modifying processes.

The following examples of laminate materials provide chemical formulations for the first and relatively thicker second layers formed on the substrate layer. The description of the invention above and the exemplary laminate structures provide a sufficient basis for understanding the operation of the invention and disclose a best mode.

EXAMPLE 1

The following table 1(A) and 1(B) provide formulations for the first relatively thin layer and the second relatively thicker layer.

TABLE 1(A)

| INGREDIENT | FUNCTION | CHEMICAL NATURE | AMOUNT |
|---|---|---|---|
| PVOH | Film former/surface finish | Poly vinyl alcohol (10%) | 20.0 |
| CN975 | Hexafunctional Urethane Acrylate | Unsaturated oligomer | 3.0 |

TABLE 1(A)-continued

| INGREDIENT | FUNCTION | CHEMICAL NATURE | AMOUNT |
|---|---|---|---|
| SR454 | Ethoxylated Trimethylol Propane Triacrylate | Unsaturated monomer | 1.0 |
| Irgacure 500/369[1] | Photoinitiator | Ketone and α-cleavage | 0.75 |
| PD 330 | Polyvinyl Acetate Polymer Dispersion | Polymer Latex | 25.0 |
| Photosynergist | Sensitize photoreaction | Thioxanthone | 0.25 |
| Diazo | Photocrosslinking agent | | 0.3 |
| Surfactants | | | 0.3 |
| Water | | | Bal. |

TABLE 1(B)

| INGREDIENT | FUNCTION | CHEMICAL NATURE | AMOUNT |
|---|---|---|---|
| PVOH | Film former/surface finish | Poly vinyl alcohol (10%) | 10.0 |
| FC170C | Surfactant | Fluoro-surfactant | 0.23 |
| BENZOFLEX | Placticizer | | 10.0 |
| PD 330 | Polyvinyl Acetate Polymer Dispersion | Polymer Latex | 25.0 |
| Dye | | | 0.04 |
| Water | | | 3.0 |
| Surfactant | Fluorosurfactant Blend | | 0.25 |
| CN975 | Hexafunctional Urethane Acrylate | Unsaturated Oligomer | 9.0 |
| SR454 | Ethoxylated Trimethylol Propane Triacrylate | Unsaturated Monomer | 3.0 |
| Irgacure 500/369[1] | Photoinitiator | | 2.2 |
| Photosynergist | Sensitize photoreaction | Thioxanthone | 0.25 |
| Diazo | Photocrosslinking agent | | 0.3 |

[1]Irgacure 500/369 is a blend of Irgacure 500 and Irgacure 369 at a weight ratio of 4:1.

The following table 2(A) and 2(B) provide formulations for the first relatively thin layer and the second relatively thicker layer.

TABLE 2(A)

| INGREDIENT | FUNCTION | CHEMICAL NATURE | AMOUNT |
|---|---|---|---|
| PVOH | Film former/surface finish | Poly vinyl alcohol (10%) | 20.0 |
| CN975 | Hexafunctional Urethane Acrylate | Unsaturated Oligomer | 3.0 |
| SR454 | Ethoxylated Trimethylol Propane Triactylate | Unsaturated Monomer | 1.0 |
| Irgacure 500/369 | Photoinitiator | | 0.5 |
| PD 330 | Polyvinyl Acetate Polymer Dispersion | Polymer Latex | 25.0 |
| Photosynergist | Sensitize Photoreaction | Thioxanthone | 0.5 |
| Diazo | Photocrosslinking agent | | 0.3 |
| Surfactants | | | 0.3 |
| Water | | | Bal. |

TABLE 2(B)

| INGREDIENT | FUNCTION | CHEMICAL NATURE | AMOUNT |
|---|---|---|---|
| PVOH | Film former/surface finish | Poly vinyl alcohol (10%) | 10.0 |
| BENZOFLEX | Placticizer | | 7.25 |
| PD 330 | Polyvinyl Acetate Polymer Dispersion | Polymer Latex | 25.0 |
| Dye | | | 0.04 |
| Water | | | 3.0 |
| Surfactant | Fluorosurfactant Blend | | 0.25 |
| CN975 | Hexafunctional Urethane Acrylate | Unsaturated Oligomer | 9.0 |
| SR454 | Ethoxylated Trimethylol Propane Triacrylate | Unsaturated Monomer | 3.0 |
| Irgacure 500/369 | Photoinitiator | | 2.4 |

TABLE 2(B)-continued

| INGREDIENT | FUNCTION | CHEMICAL NATURE | AMOUNT |
|---|---|---|---|
| Photosynergist | Sensitize photoreaction | Thioxanthone | 0.05 |
| Diazo | Photocrosslinking agent | | 0.3 |

The following table 3(A) and (B) provide formulations for the first relatively thin layer and the second relatively thicker layer.

TABLE 3(A)

First Layer

| INGREDIENT | FUNCTION | CHEMICAL NATURE | AMOUNT |
|---|---|---|---|
| Photopolymer 2 | | Aqueous solution- 11 wt. % solids- PVOH grafted with the photosensitive material (see MASM-Formulae2) | 50.0 |
| PD 330 | PV Acetate emulsion | | 6.0 |
| Surfactant | | | 0.3 |
| Water | | | 43.7 |

TABLE 3(B)

Second Layer

| INGREDIENT | FUNCTION | CHEMICAL NATURE | AMOUNT |
|---|---|---|---|
| Photopolymer 1 | | Aqueous solution- 11 wt. % solids- PVOH grafted with the photosensitive material (see ASM-Formulae 1) | 22.15 |
| PD 330 | PVAC emulsion | | 60.18 |
| FC 170c | Fluoro-Surfactant | | 0.57 |
| K. VIOLET | Dye | | 0.04 |
| Water | | | 6.03 |
| Benzoflex 284 | Plasticizer | | 6.69 |
| Slip Ayd 300 | Surface conditioner | | 4.34 |

Photopolymer 1 is a (ASM) λmax 342 nm, see formulae 1.
Photopolymer 2 is a (MASM) λmax 376 nm, see formulae 2.

The following table 4(A) and 4(B) provide formulations for the first relatively thin layer and the second relatively thicker layer.

TABLE 4(A)

First Layer

| INGREDIENT | FUNCTION | CHEMICAL NATURE | AMOUNT |
|---|---|---|---|
| Photopolymer 2 | | Aqueous solution- 11 wt. % solids- PVOH grafted with the photosensitive material (see MASM-Formulae2) | 50.0 |
| PD 330 | PV Acetate emulsion | | 6.0 |
| Surfactant | | | 0.3 |
| Water | | | 43.7 |

TABLE 4(B)

Second Layer

| INGREDIENT | FUNCTION | CHEMICAL NATURE | AMOUNT |
|---|---|---|---|
| Photopolymer 1 | | Aqueous solution-11 wt. % solids-PVOH grafted with the photosensitive material (see ASM-Formulae 1) | 14.5 |
| PD 330 | PVAC emulsion | | 55.38 |
| Surfactant | | | 0.23 |
| K. VIOLET | Dye | | 0.04 |
| Water | | | 4.0 |
| Plasticizer | | | 20.5 |
| HO-Phenol Benzotriazole | UV absorber | | 1.0 |
| Surface conditioner | | | 4.35 |

The following table 5(A) and 5(B) provide formulations for the first relatively thin layer and the second relatively thicker layer

TABLE 5(A)

First Layer

| INGREDIENT | FUNCTION | CHEMICAL NATURE | AMOUNT |
|---|---|---|---|
| Photopolymer 1 | | Aqueous solution-11 wt. % solids-PVOH grafted with the photosensitive material (see ASM-Formulae 1) | 6.75 |
| Photopolymer 2 | | Aqueous solution-11 wt. % solids-PVOH grafted with the photosensitive material (see MASM-Formulae2) | 20.27 |
| CN975 | Hexafunctional Urethane Acrylate | Unsaturated Oligomer | 3.11 |
| SR454 | Ethoxyiated Trimethylol Propane Triacrylate | Unsaturated Monomer | 0.93 |
| Irgacure 500/369 | Photoinitiator | (0.51 gms and 0.13 gms-4:1 blend) | 0.64 |
| PD 330 | Polyvinyl Acetate Polymer Dispersion | Polymer Latex | 18.06 |
| Photosynergist (optional) | Accelerate Reaction | Thioxanthone | 0.0 or 0.25 |
| Silwet L7001; Silwet L7604 and Rhodofac RA 600 | Surfactant blend | (0.12 gms; 0.04 gms and 0.11 gms) | 0.27 |
| Water | | | Bal. |

TABLE 5(B)

Second Layer

| INGREDIENT | FUNCTION | CHEMICAL NATURE | AMOUNT |
|---|---|---|---|
| Photopolymer 1 | | Aqueous solution-11 wt. % solids-PVOH grafted with the photosensitive material (see ASM-Formulae 1) | 10.0 |
| BENZOFLEX | Placticizer | | 7.25 |
| PD 330 | Polyvinyl Acetate Polymer Dispersion | Polymer Latex | 65.0 |
| Dye | | | 0.04 |
| Water | | | 3.0 |
| Surfactant | Fluorosurfactant Blend | | 0.4 |
| CN975 | Hexafunctional Urethane Acrylate | Unsaturated oligomer | 9.0 |
| SR454 | Ethoxylated Trimethylol | Unsaturated monomer | 3.0 |

TABLE 5(B)-continued

Second Layer

| INGREDIENT | FUNCTION | CHEMICAL NATURE | AMOUNT |
|---|---|---|---|
| Irgacure 500/369 | Propane Triacrylate Photoinitiator | | 2.2 |
| Photosynergist | Sensitizes photoreaction | Thioxanthone | 0.25 |
| UV absorber | HO-phenol benzotriazole | | 1.0 |

The following table 6(A) and 6(B) provide formulations for the first relatively thin layer and the second relatively thicker layer. The thicker photosensitive layer having pressure sensitive properties.

TABLE 6(A)

First Layer

| INGREDIENT | FUNCTION | CHEMICAL NATURE | AMOUNT |
|---|---|---|---|
| Photopolymer 2 | | Aqueous solution- 11 wt. % solids- PVOH grafted with the photosensitive material (see MASM-Formulae2) | 20.0 |
| CN975 | Hexafunctional Urethane Acrylate | Unsaturated Oligomer | 3.0 |
| SR454 | Ethoxylated Trimethylol Propane Triacrylate | Unsaturated Monomer | 1.0 |
| Irgacure 500/369 | Photoinitiator | | 0.75 |
| PD 330 | Polyvinyl Acetate Polymer Dispersion | Polymer Latex | 25.0 |
| Photosynergist | Accelerate Reaction | Thioxanthone | 0.25 |
| Surfactants | | | 0.3 |
| Water | | | Bal. |

TABLE 6(B)

Second Layer

| INGREDIENT | FUNCTION | CHEMICAL NATURE | AMOUNT |
|---|---|---|---|
| Photopolymer 1 | | Aqueous solution- 11 wt. % solids- PVOH grafted with the photosensitive material (see ASM-Formulae 1) | 19 |
| United Adhesive XR50-1224 | | | 35 |
| PVACXR2223 | Polyvinyl Acetate | | 24 |
| FC-171 | Fluorosurfactant | Surfactant | 0.3 |
| Pure Water | | | 0.3 |
| Glycerol | | Plasticizer | 9.0 |
| RL-130 | | | 0.1 |

The following table 7(A) and 7(B) provide formulations for the first relatively thin layer and the second relatively thicker layer

TABLE 7(A)

First Layer

| INGREDIENT | FUNCTION | CHEMICAL NATURE | AMOUNT |
|---|---|---|---|
| Photopolymer 1 | | Aqueous solution- 11 wt. % solids- PVOH grafted with the photosensitive material | 20.0 |

TABLE 7(A)-continued

First Layer

| INGREDIENT | FUNCTION | CHEMICAL NATURE | AMOUNT |
|---|---|---|---|
| CN975 | Hexafunctional Urethane Acrylate | (see ASM-Formulae 1) Unsaturated Oligomer | 3.0 |
| SR454 | Ethoxylated Trimethylol Propane Triacrylate | Unsaturated Monomer | 1.0 |
| Irgacure 500/369 | Photoinitiator | | 0.75 |
| PD 330 | Polyvinyl Acetate Polymer Dispersion | Polymer Latex | 25.0 |
| Photosynergist | Sensitizes Photoreaction | Thioxanthone | 0.25 |
| Surfactants | | | 0.3 |
| Water | | | Bal. |

TABLE 7(B)

Second Layer

| INGREDIENT | FUNCTION | CHEMICAL NATURE | AMOUNT |
|---|---|---|---|
| Photopolymer 2 | | Aqueous solution-11 wt. % solids-PVOH grafted with the photosensitive material (see MASM-Formulae2) | 10.0 |
| BENZOFLEX | Placticizer | | 7.25 |
| PD 330 | Polyvinyl Acetate Polymer Dispersion | Polymer Latex | 65.0 |
| Dye | Light absorber | Ponolith Blue | 0.04 |
| Water | | | 3.0 |
| Surfactant | Fluorosurfactant blend | | 0.4 |
| CN975 | Hexafunctional Urethane Acrylate | Unsaturated oligomer | 9.0 |
| SR454 | Ethoxylated Trimethylol Propane Triacrylate | Unsaturated monomer | 3.0 |
| Irgacure 500/369 | Photoinitiator | | 2.2 |
| Photosynergist | Sensitizes photoreaction | Thioxanthone | 0.25 |
| UV absorber | HO-phenol benzotriazole | | 1.0 |

In the above examples, in Example 1(A), first layer and 1(B), second layer, the layers will have dissimilar photosensitive properties due to the levels of photoinitiator and photosynergist. In Examples 2(A), first layer and 2(B), second layer, the concentration of the photoinitiator and photosynergist in the first layer causes the first layer to expose more rapidly than the second. An alternative to the second layer in Example 2(B), the photosynergist can be eliminated for a marked difference in exposure rate. In Example 3(B), a different photopolymer is used in the first layer. This photopolymer has a $\lambda_{max}$ of 376 nm and when exposed to higher wavelength radiation exposes more quickly than a photopolymer in Example 3(B), second layer. In Example 4(B), second layer, a UV absorber has been added to slow the exposure of the second layer causing the first layer to be more sensitive to actinic radiation. Example 5(A), first layer, and 5(B), second layer, are similar to Example 1(A) and 1(B) in that Example 1(A) and 1(B) use radiation curable PVOH and diazo with acrylate materials, while Example 5(A) and 5(B) use radiation curable photopolymer with acrylate. However, Example 5(B), second layer, uses a UV absorber and different levels of photoinitiator to slow the exposure of the second layer. The formulations in 6(A) and 6(B) describe a useful laminate and the 6(B) layer is modified to introduce pressure sensitive adhesive properties. The Examples 7(A) and 7(B) are comparable to 5(A) and 5(B) except that different photopolymers having different $\lambda_{max}$ are used.

The photoresist laminate of the invention can utilize adhesive properties or materials to adhere the laminate to an object surface for surface modification. The adhesive can be directly applied to the surface, can be directly applied to the laminate or one or more layers of the laminate can be made self-adherent for the purpose of adhering the laminate to the object. The adhesive layer can be water activated, pressure sensitive, heat activated or other adhesive form. An adhesive layer or a self-adherent laminate layer preferably operates in a pressure sensitive adhesive mode. Pressure sensitive adhesives are adhesives having a high degree of surface tack and sufficient cohesive strength to maintain an adhesive bond and survive manipulations. Pressure sensitive adhesives tend to bond substantially instantaneously with slight contact pressure to a surface. In practice, pressure sensitive adhesives are often used in conjunction with pressure sensitive adhesive release liners. Such liners comprise a backing material such as paper, textile, film, metal foil, etc. having generally silicone based release coating to ensure that the release liner can be removed from the adhesive without reducing the adhesive properties of the pressure sensitive adhesive layer. Pressure sensitive adhesives typically comprise a polymeric composition in combination with a tackifier and an extender composition which is typically applied to a substrate either using hot melt or solution casting techniques. Typical base polymers for the pressure sensitive adhesive include rubbers, styrene elastomers, styrene block copolymers such as craton rubbers, synthetic polymers such as polyvinylacetate or acrylate polymers. Typical tackifiers include polymeric materials made from natural products or synthetic monomers. Such tackifiers, extenders, extending oils, plasticizers, etc. are all well known materials available to the skilled artisan.

Figure 1:
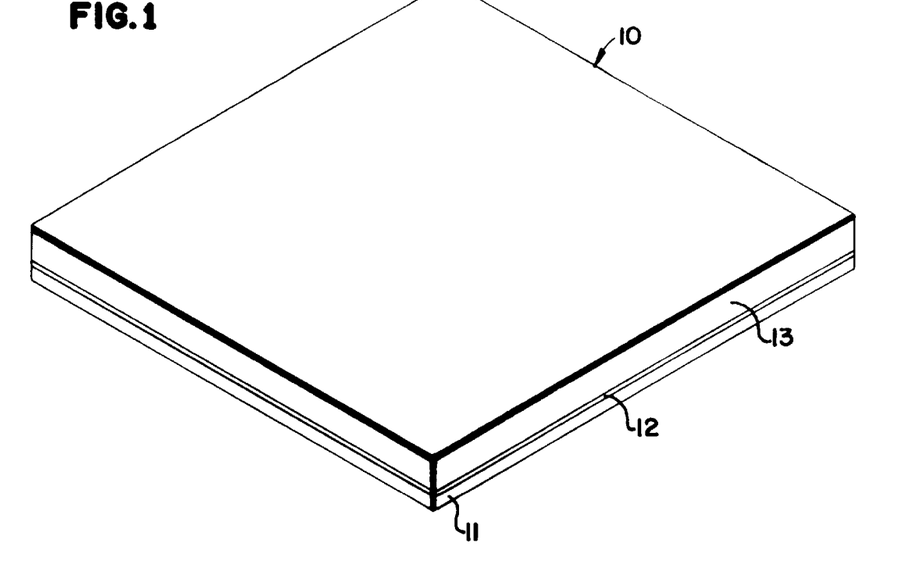
FIG. 1 is a view of a generally rectangular portion of a preferred three layer resist laminate of the invention.

A photosensitive layer such as the thicker photosensitive layer 13 in the laminate in FIG. 1 can be made inherently self-adhering or pressure sensitive. An adhesive material can be added to the laminate layer to produce a pressure sensitive layer. Alternatively, by using a polyvinylacetate based composition in the layer, to which can be added an effective amount of a tackifier, plasticizer, or an extending oil or other material an adhesive layer can be constructed. The tackifier tends to introduce pressure sensitive properties into the photosensitive layer. Alternately, a thin pressure sensitive adhesive layer can be formed on the top of the laminate 10 of FIG. 1. Such a layer can comprise a base polymer, a tackifier and optionally a plasticizer or extender material. Lastly, such a pressure sensitive adhesive can be applied to the object at the location of surface modification to which the laminate can be directly applied for surface modifying operations with the exposed laminate.

METHODS OF USE

The photoresist laminate articles of the invention are typically used by adhering an imaged laminate structure to the surface of an object in order to introduce patterns pf modifications into or on the surface. Such patterns can be made using the laminate structures of the invention in a variety of methods resulting in the desired shape and depth of the pattern. Typically, the laminate is first exposed on the support side of the laminate to form the thin integral membrane layer. A mask with a desired image is then applied typically to the side of the laminate comprising the second photoimageable layer. The second layer is then imagewise exposed to actinic radiation passing through the mask leaving at least a latent image in the second photoimageable layer. The imaged layer is then developed and washed conventionally. The layer can then be applied to a surface, the support layer is removed and is then etched or sandblasted with particulates. The sandblast can remove any of the first layer that remains on the second imaged layer and the blast can also form an image in the surface of the substrate.

In a first preferred operational mode, the three layer laminate structure of the invention is used by first exposing the laminate on the support side with actinic radiation in sufficient quantity and for sufficient time to expose only the first layer. Such exposure results in a substantial increase in insolubility of the first layer. Next, the second layer is image wise exposed to actinic radiation forming areas of relative insolubility in the second layer. The image is developed conventionally and the laminate structure of the invention is then applied to the surface of an object for surface modification and the transfer of a desired pattern to the object surface. Typically, the second layer is adhered to the surface of the object with adhesive application or having a self-adhesive component in the second layer. Once the three layer structure is securely adhered to the object, the carrier or support layer is removed. While the first layer can be removed at this stage using mechanical and chemical techniques, typically the substrateless structure comprising the exposed first and the imaged and developed second layer is then blasted with an etching typically sand in a sandblast mode. The sandblast removes the thin first layer and in areas devolved by the water or solvent, etches the surface where the second layer has been removed in the developing process. Once a sufficient image is etched into the surface, the remaining portion of the laminate is removed typically with chemical or mechanical methods.

An alternative method of using the laminate of the invention involves first exposing the three layer structure to actinic radiation from the support side for a sufficient period of time to fully expose the thin first layer. The three layer laminate can then be imaged by exposing the second layer imagewise to actinic radiation to form at least a latent image. Once formed, the image can then be conventionally developed, with an aqueous or non-aqueous liquid developing materials, and dried. The carrier layer can be removed and the laminate applied as disclosed. Such a method is particularly useful with a thicker second layer. The imaged structure can then be applied to the surface for imaging followed by contacting with an imaging composition such as a sandblast stream.

A further alternative for using the three layer structures of the invention involve first exposing the three layer structure to actinic radiation from the support side. Such radiation renders the first thinner layer relatively less soluble than the unexposed second layer. The second layer is then exposed image wise to actinic radiation sufficient to form at least a latent image in the second layer. At this stage, the carrier layer can be removed and the first and second layers developed in a conventional aqueous or solvent based developing solution. The developed structure when dried is then applied to a surface of the object for imaging and the object is exposed to a sandblast surface modification step. After the image is formed, the remaining resist materials can be removed conventionally using chemical or mechanical means.

Regardless of the mode of use of the three layer structure of the invention, the properties of the thin first layer should be kept in mind. First, the layer is relatively thin in comparison to the support and the second photosensitive layer. Such a layer is fragile but has sufficient mechanical stability, after exposure, to be useful. Care should be taken that the first layer is not damaged during processing. The first layer is also somewhat water sensitive and can swell in the presence of aqueous developing liquids. The nature of the first layer is such that control over exposure is important. The layer should be exposed carefully such that the first layer contains no image and is converted into a relatively less soluble uniform thin layer in association with the second layer. The second layer should be exposed in a careful manner such that the second layer is fully imaged. Any portion of the second layer removed during development leaves the exposed areas of photocured or photohardened polymer in contact with the first layer.

DETAILED DESCRIPTION OF THE DRAWINGS

FIG. 1 shows an embodiment of the photosensitive laminate structure 10 of the invention. In the laminate 10, a support or carrier layer comprising typically a polyester film 11 is shown. Coated on the film 11 is a first relatively thin photosensitive layer 12. Coated on the first photosensitive layer 12 is a relatively thicker second photosensitive layer 13. The formulations, thicknesses and processing renders the laminate uniquely operable to image formation on the surface of an object.

Figure 2A:
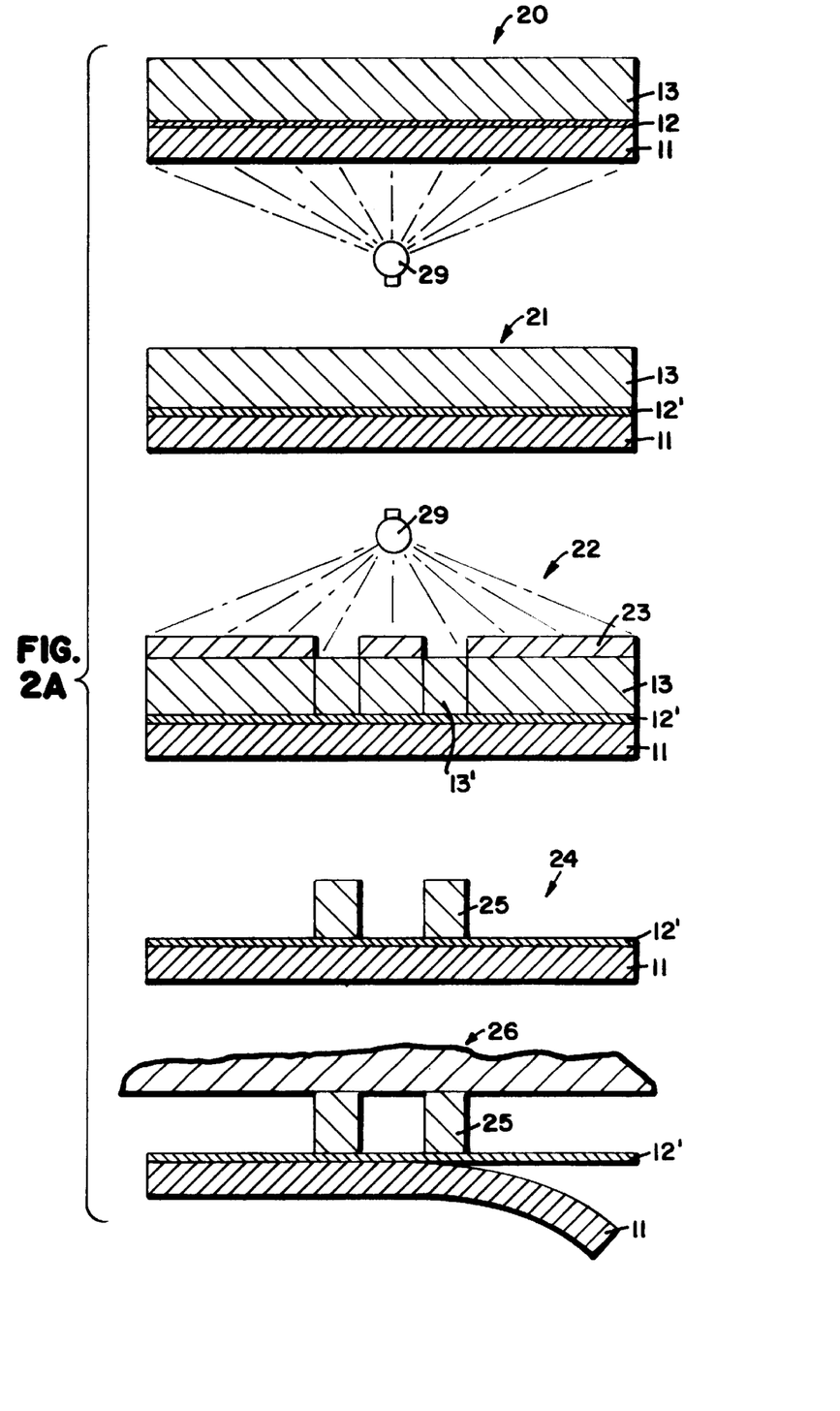
FIG. 2 are diagrams of useful methods of forming the integral membrane structure in one aspect of the three layer laminate of the invention.

FIG. 2a shows a three layer laminate 20 of the invention comprising a carrier layer 11, a first photosensitive layer 12 and a second relatively thicker photosensitive layer 13. The laminate 20 is exposed to the effects of actinic radiation 29 which is carefully controlled to expose only the first photosensitive layer 12. The effects of the actinic radiation produces a laminate 21 identical to laminate 20 except that the first photosensitive layer 12' is now exposed crosslinked and relatively less soluble when compared to the second photosensitive layer 13. The three layer laminate 21 is then masked with a master or original artwork 23 to form the laminate 22 which again can be exposed to the effects of actinic radiation 29. The actinic radiation in cooperation with the mask exposes only the revealed portion of the second photosensitive layer 13 forming exposed crosslinked areas 13'. The mask 23 is removed from the exposed structure 22. The exposed and unexposed 13' and unexposed 13 areas of the second photosensitive area are conventionally developed forming the developed structure 24. The developed structure 24 with the developed pattern 25 is then adhered to a surface 26 with an aqueous adhesive wherein the carrier layer 11 is peelably removed from the exposed relatively insoluble layer 12'. After the carrier or film layer 11 is removed, the object is subject to the effects of sandblasting resulting in the image modification of the surface. After blasting is complete, the remaining imaged portions of the laminate structure can be removed conventionally.

Figure 2B:
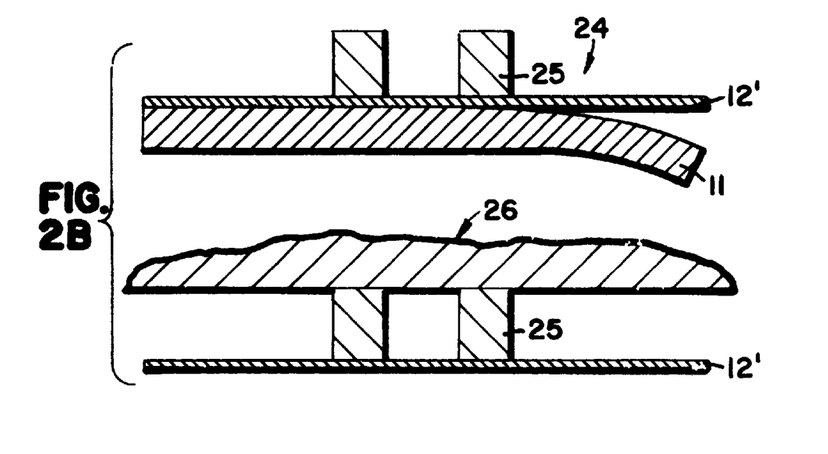

FIG. 2b shows one variation of the imaging method of the invention. In FIG. 2b, the carrier or film layer 11 is removed from the exposed first photosensitive layer 12' and from the other components of the exposed and developed structure 24. After the carrier layer 11 is removed, the remaining components of the laminate is applied to a surface 26 and sandblasted to transfer the image to the surface 26.

Figure 2C:
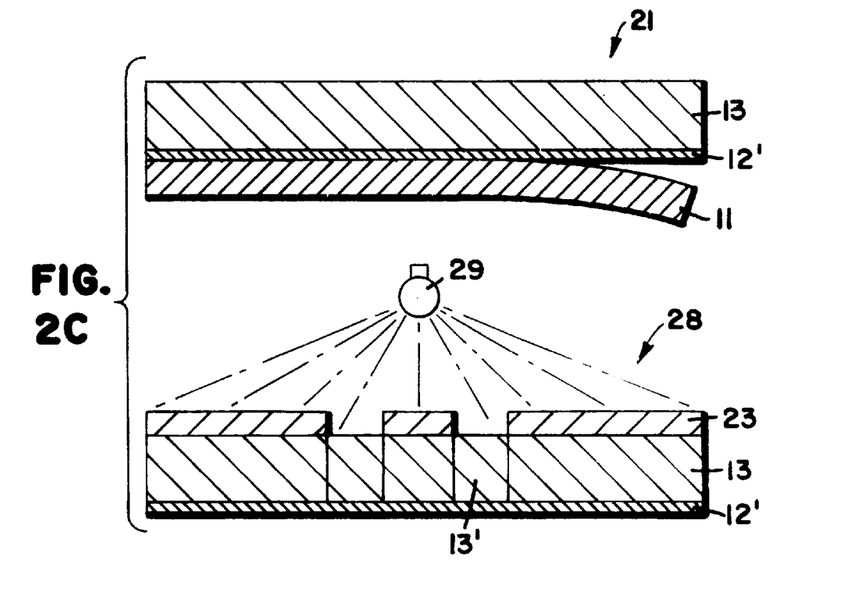

A further option in forming the image using the laminate of the invention is shown in FIG. 2c in which the laminate structure 21 comprising a carrier layer 11, an exposed first layer 12' and a second photosensitive layer 13 is processed by first removing the carrier film layer 11. A mask 23 is applied to the second photosensitive layer 13 which is then exposed to actinic radiation 29 developing an image 13' in the second photosensitive layer 13 forming an exposed laminate 28. The exposed, processed laminate 28 is used by first removing mask 23 and then developing and applying the imaged layer conventionally.

Figure 3:
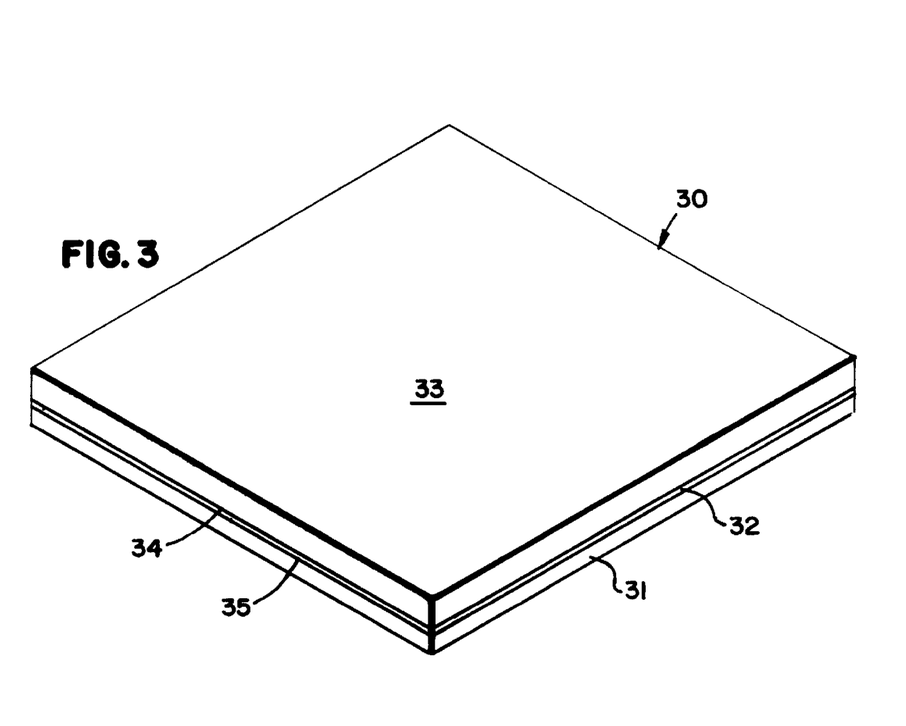
FIG. 3 is a view of a generally rectangular portion of an embodiment of the laminate of the invention containing a release layer between the support and the photosensitive layers and between the photosensitive layers.

FIG. 3 shows an embodiment of the three layer structure 30 of the invention. In FIG. 3, the support film or carrier layer 31 is shown coated with a release coating 35. A thin photocrosslinkable layer 32 is formed on the release layer 35. The thin layer 32 is also covered with a release layer 34 and upon release layer 34 is formed the photosensitive layer 33.

Figure 4:
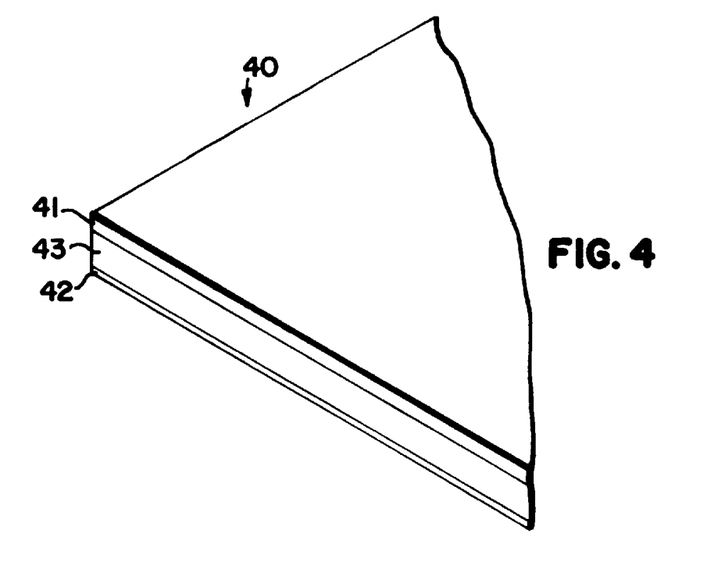
FIG. 4 is a view of a generally rectangular portion of an aspect of the three layer laminate of the invention.

FIG. 4 shows an embodiment of the three layer photosensitive structure or laminate of the invention 40. In laminate 40, the carrier film or support layer 41 is shown next to the relatively thicker photosensitive layer 43. The relatively thinner photosensitive layer 42 is formed on the relatively thicker photosensitive layer 43 opposite from the carrier layer 41.

Figure 5:
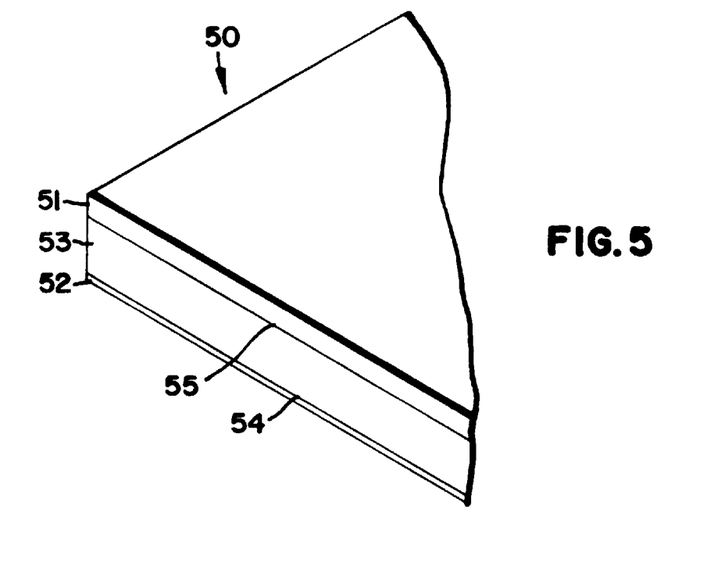
FIG. 5 is a view of a generally rectangular portion of an aspect of the three layer laminate of the invention containing a release layer between the support and the photosensitive layers and between the photosensitive layers.

FIG. 5 shows a structure similar to that of FIG. 4 except that the laminate has release layers 54 and 55 in the laminate 50. Release layer 54 separates the thinner photosensitive layer 52 from the relatively thicker photosensitive layer 53. Further, release layer 55 separates the relatively thicker photosensitive layer 53 from the carrier layer 51.

Figure 6A:
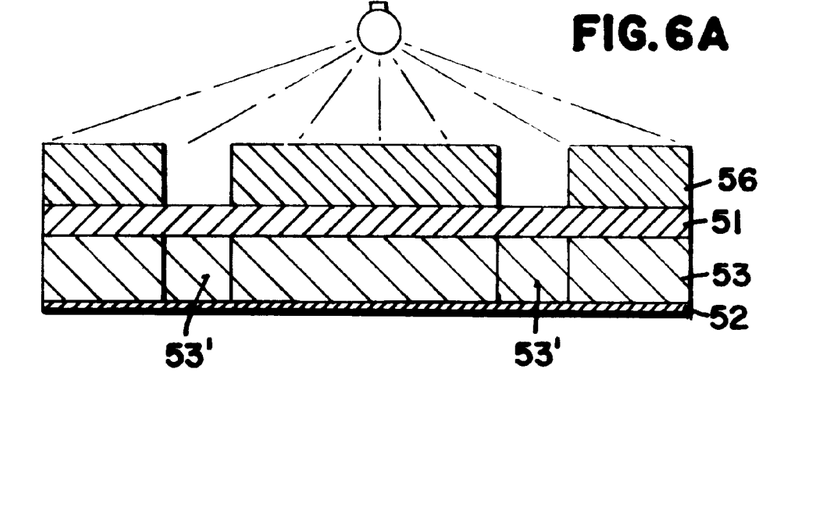
FIGS. 6 and 7 are diagrams of useful methods of forming an image with the integral membrane in one aspect of the three layer laminate of the invention.
Figure 6B:
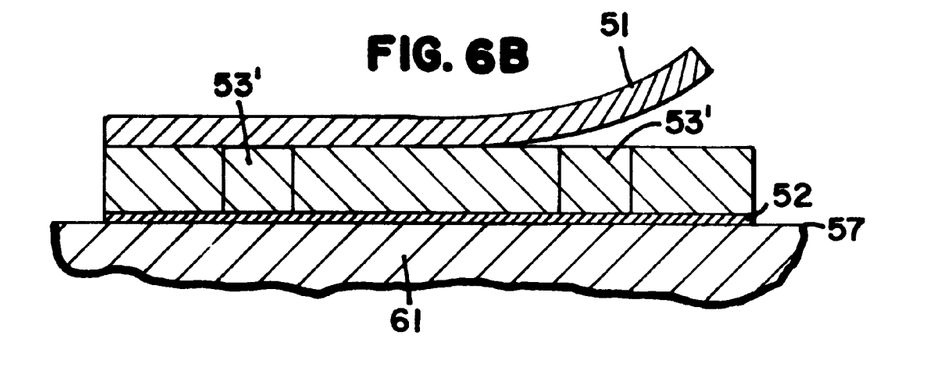
Figure 6C:
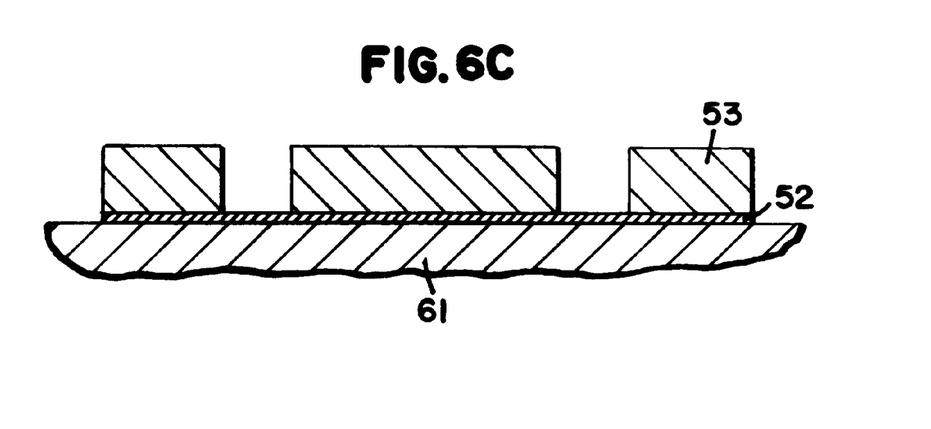

FIG. 6 shows a process for using the photosensitive laminate of FIG. 5. Original artwork 56 is applied to a transparent carrier layer 51 and the structure is imagewise exposed to actinic radiation creating exposed areas 53', the relatively thinner layer 52 previously exposed. The artwork 56 is removed. The three layer exposed structure is then applied to surface 61 and carrier layer 51 is removed. The structure is developed conventionally and then exposed to the effects of a blast forming surface modifications into the object surface in a desired pattern.

Figure 7A:
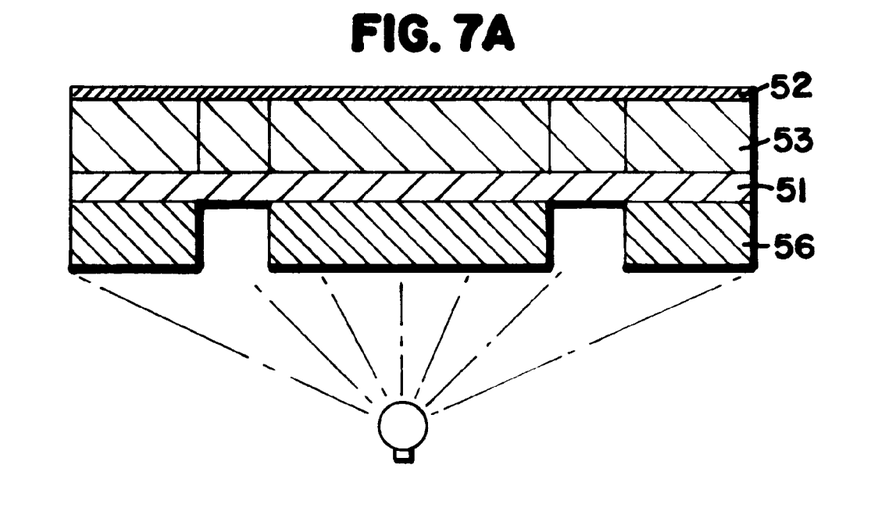
Figure 7B:
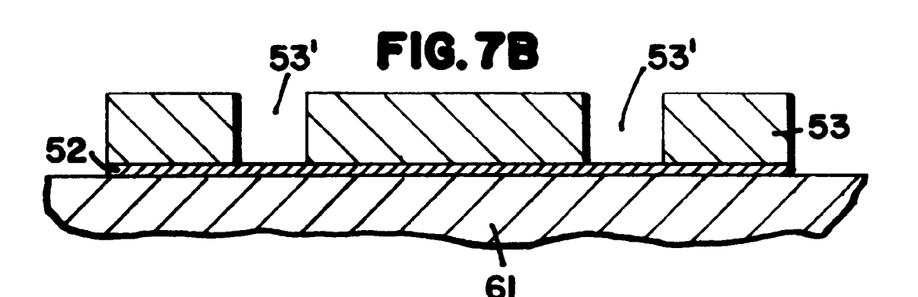
Figure 7C:
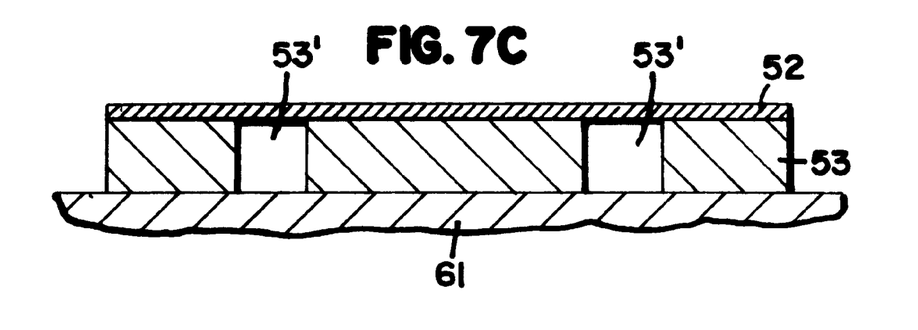

FIG. 7 shows an alternative process for using the photosensitive laminate of FIG. 5. In FIG. 7, original artwork 56 is applied to the carrier layer of the laminate of FIG. 5, relatively thinner layer 52 previously exposed. The laminate is then exposed imagewise to actinic radiation, and conventionally developed. Both layers 51 and 56 are removed from the laminate. The remaining laminate layers 52 and 53 are then applied to surface 61 in one of two orientations; either the relatively thinner layer 52 is applied to the surface or the relatively thicker layer 53 is applied to the surface. In either orientations, the sandblast will effectively remove the relatively thinner layer 52 and transfer to surface modification the desired pattern from the imaged layer 53.

The foregoing description, examples, methods of use and other disclosures in the specification provide a basis for understanding the laminate materials and the operation of the invention. However, since many embodiments of the invention can be made without departing from the spirit or scope of the invention, the invention resides in the claims hereinafter appended.

We claim:

1. A photosensitive laminate structure comprising:
    (a) a film substrate layer having a thickness of less than about 0.6 mm;
    (b) a first photosensitive layer having a thickness of about 0.3 to 1 mm, the first photosensitive layer coated on the substrate; and
    (c) a second photosensitive layer having a thickness of 1 to 10$\mu$, the second photosensitive layer coated on the first layer, wherein the first layer comprises a photosensitive material different in formulation than the photosensitive material of the second layer.

2. The laminate of claim 1 wherein the second photosensitive layer comprises a stilbazolium photosensitive material.

3. The laminate of claim 1 wherein a release layer coating is positioned in the laminate between the photosensitive layers.

4. The laminate of claim 1 when the entire laminate structure is exposed to actinic radiation and the entire second photosensitive layer is made substantially less soluble in comparison to the first photosensitive layer.

5. The laminate of claim 1 wherein the first photosensitive layer comprises a stilbazolium photosensitive material.

6. The laminate of claim 1 wherein the first photosensitive layer comprises a stilbazolium photosensitive material and the second photosensitive layer comprises a stilbazolium material different than the first photosensitive layer.

7. The laminate of claim 1 wherein the first photosensitive layer comprises a diazo photosensitive material and the second photosensitive layer comprises a stilbazolium photosensitive material.

8. The laminate of claim 1 wherein the first photosensitive layer comprises a diazo photosensitive material and the second photosensitive layer comprises an acrylate photosensitive material.

9. The laminate of claim 1 wherein the first photosensitive layer comprises a photosensitive material different in $\lambda_{max}$ by at least 10 nm when compared to the material of the second photosensitive layer.

10. The laminate of claim 9 wherein the composition in the first photosensitive layer comprises a different photopolymer than the second photosensitive layer.

11. The laminate of claim 9 wherein the composition in the first photosensitive layer comprises a different concentration of a photosynergist than the second layer.

12. The laminate of claim 9 wherein the composition in a photosensitive layer comprises an absorber of actinic radiation.

13. The laminate of claim 9 wherein the composition in the first photosensitive layer comprises a photosensitive material with increased photosensitivity when compared to the second photosensitive layer.

14. The laminate of claim 9 wherein the composition in the first photosensitive layer comprises a different concentration of a photoinitiator when compared to the second photosensitive layer.

15. A photosensitive laminate structure comprising:
   (a) a film substrate layer having a thickness of less than about 0.3 mm;
   (b) a first photosensitive layer having a thickness of 1 to 10 microns, the first photosensitive layer coated on the substrate; and
   (c) a second photosensitive layer having a thickness of about 0.3 to 1 mm, the second photosensitive layer coated on the first photosensitive layer
wherein a release layer is positioned between the first photosensitive layer and the second photosensitive layer and the first photosensitive layer comprises a photosensitive material different in formulation than the photosensitive material of the second photosensitive layer.

16. The laminate of claim 15 wherein the first photosensitive layer comprises a photosensitive material different in $\lambda_{max}$ by at least 10 nm when compared to the material of the second photosensitive layer.

17. The laminate of claim 16 wherein the photosensitive material in the first photosensitive layer comprises a photosensitive composition different than that in the second photosensitive layer.

18. The laminate of claim 17 wherein the composition in the photosensitive layer comprises a different photopolymer.

19. The laminate of claim 17 wherein the composition in the first photosensitive layer comprises a different concentration of a photosynergist than the second photosensitive layer.

20. The laminate of claim 17 wherein the composition in the first photosensitive layer comprises an absorber of actinic radiation.

21. The laminate of claim 17 wherein the composition in the first photosensitive layer comprises a photosensitive material with increased photosensitivity when compared to the second photosensitive layer.

22. The laminate of claim 17 wherein the composition in the first photosensitive layer comprises a different concentration of a photoinitiator when compared to the second photosensitive layer.

23. The laminate of claim 15 wherein the second photosensitive layer comprises a stilbazolium photosensitive material.

24. The laminate of claim 15 when the entire laminate is exposed to actinic radiation and the entire photosensitive layer is made substantially less soluble in comparison to an unexposed second photosensitive layer.

25. The laminate of claim 15 wherein the first photosensitive layer comprises a stilbazolium photosensitive material.

26. The laminate of claim 15 wherein the first photosensitive layer comprises a stilbazolium photosensitive material and the second photosensitive layer comprises a stilbazolium material different than the photosensitive layer.

27. The laminate of claim 15 wherein the first photosensitive layer comprises a diazo photosensitive material and the second photosensitive layer comprises a stilbazolium photosensitive material.

28. The laminate of claim 15 wherein the first photosensitive layer comprises a diazo photosensitive material and the second photosensitive layer comprises an acrylate photosensitive material.

* * * * *